May 1, 1962 A. F. MARTZ, JR., ETAL 3,031,855
TRANSISTOR CONTROL CIRCUIT
Filed Oct. 3, 1960
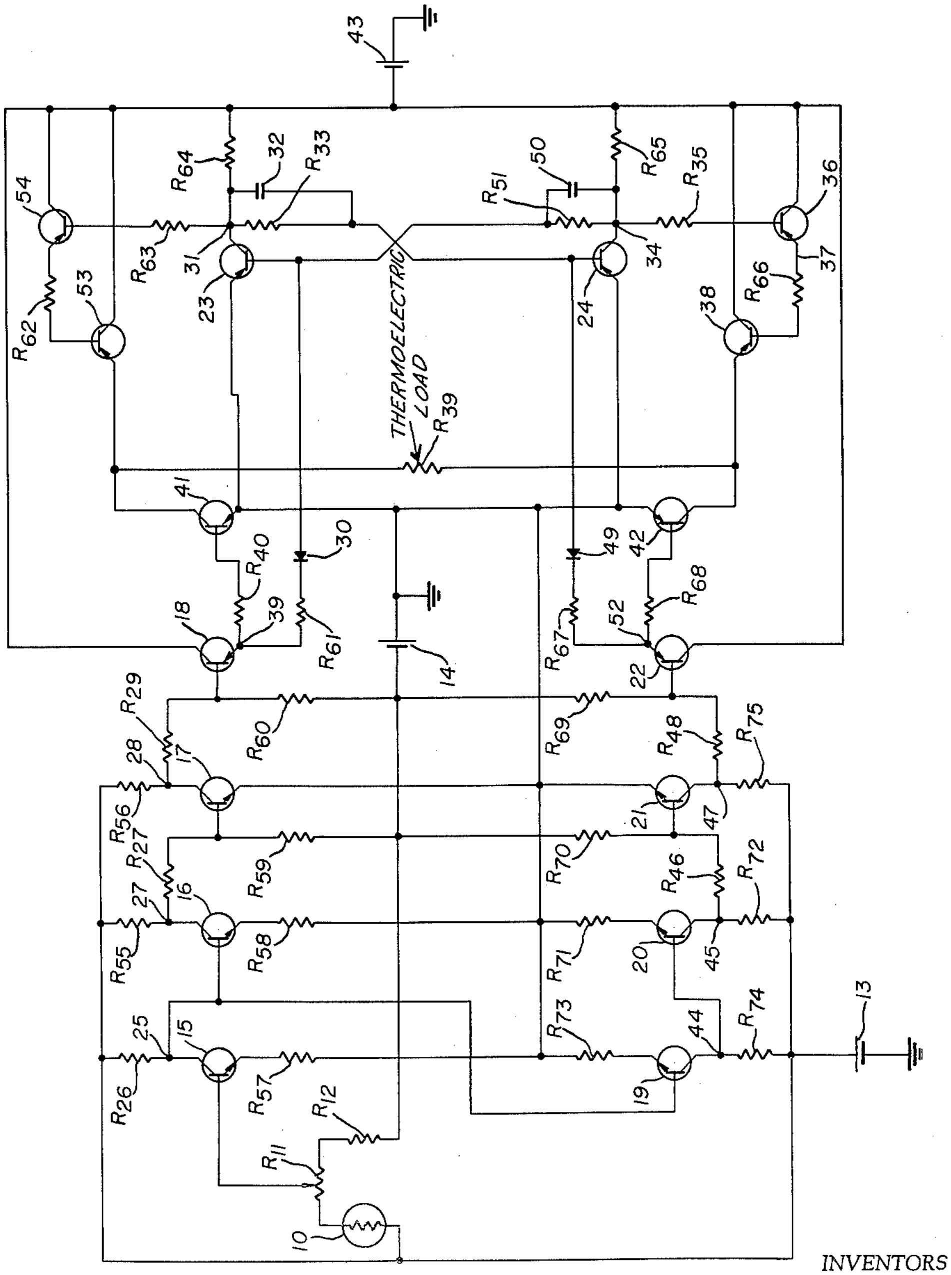
INVENTORS
ARTHUR F. MARTZ, JR.
ALLAN L. WENNERBERG
BY Sughrue, Rothwell, Mion & Zinn
ATTORNEYS 3,031,855
Patented May 1, 1962

3,031,855

TRANSISTOR CONTROL CIRCUIT

Arthur F. Martz, Jr., Benton Harbor, and Allan L. Wennerberg, St. Joseph, Mich., assignors to Whirlpool Corporation, a corporation of Delaware Filed Oct. 3, 1960, Ser. No. 59,973
10 Claims. (Cl. 62—3)

This invention relates to a transistorized circuit for controlling current flow through thermoelectric elements to provide alternate heating and cooling as required and more particularly to a transistorized control circuit including a temperature responsive element for sensing the temperature within an enclosure to provide alternate heating and cooling as required for the purpose of maintaining a substantially constant temperature within said enclosure.

Many forms of electronic equipment involve the use of quartz crystal oscillators. Due to the temperature instability of the quartz crystal in such oscillators, the frequency of operation of the electronic equipment may vary according to the ambient temperature surrounding the enclosure for the oscillator as it affects said crystal. It is often necessary, therefore, to provide means of stabilizing the temperature of the medium surrounding the crystal. One convenient way of maintaining substantially constant temperature is to place the crystal oscillator adjacent thermoelectric elements which provide alternate heating and cooling as required so that a substantially constant temperature is maintained regardless of the ambient temperature. The present invention finds particular utility, although not exclusive utility, in such an environment.

The transistor circuit of the present invention provides a means for controlling the direction of current as well as the magnitude of current passing through thermoelectric elements to provide the proper amount of cooling and heating required to maintain a substantially constant temperature surrounding the crystal oscillator. Typical thermoelectric elements are more fully disclosed in the co-pending Mervin K. Baer, Jr. and Charles R. Lopp application, Serial No. 735,804, filed May 16, 1958, now abandoned, and assigned to the same assignee.

It is therefore an object of the present invention to provide an efficient, low-cost transistorized control circuit to effect control of the magnitude and change in direction of current flow in a load, more particularly in a load which is comprised of thermoelectric elements.

Another object of the present invention is to provide such a control in which the load currents range from about 0 to 25 amperes.

A still further object of the invention is to provide such a circuit in which sudden changes in direction of current flow through the load are afforded.

A still further object of the invention is to provide such a control circuit in which the temperature of the enclosure may be maintained at approximately 25° C. plus or minus .1° C., even though the ambient temperature surrounding the enclosure may vary from —30° C. to +85° C.

These and other objects of the present invention will become apparent from a more detailed description of the accompanying drawing.

In general, the present invention includes a voltage divider in which one of the impedances is a thermistor which is temperature sensitive. This thermistor increases in impedance with decreases in temperature and decreases in impedance with increases in temperature. The impedance of said thermistor causes the generation of a signal (D.C. level) which is proportionate to the temperature of the medium being controlled. This signal may be either a cooling demand signal or a heating demand signal, depending on whether or not said temperature is above or below the selected temperature. A bistable trigger having what might be termed a cooling stable state and a heating stable state is switched to its appropriate state by the character of said demand signal. The state of said trigger cooperating with said demand signal switches one of two transistors to its conducting state to thereby provide a D.C. current path through a load composed of said thermoelectric elements in either a cooling or heating direction. The magnitude of the current through said load is a function of the magnitude of said demand signal which in turn is a function of the impedance of said thermistor. The direction of said current is a function of the character of said demand signal. The trigger maintains the direction until the temperature of the medium is changed so that the thermistor causes the generation of the other type of demand signal.

The D.C. level which is generated by the voltage divider including the thermistor is amplified in one phase by a first amplifier and in an opposite phase by a second amplifier. The outputs are then out of phase and since these outputs control the state of the trigger and cooperate with the state of said trigger to govern the current conducting state of said two switching transistors, only one of said two transistors is conducting at a time to determine the direction of current through the load.

The single FIGURE is circuit diagram of a preferred embodiment of the present invention.

With reference to the single figure, a voltage divider is composed of the thermistor 10, the variable resistor $R_{11}$ and resistor $R_{12}$. The setting of the tap on the variable resistor $R_{11}$ effectively sets the selected temperature of the medium. The thermistor is positioned in said medium and the thermoelectric elements are similarly positioned. Across this voltage divider is effectively placed 24 volts by virtue of the battery 13 and the battery 14, both of which are 12-volt batteries connected as shown. N-P-N transistors 15, 16 and 17, and P-N-P transistor 18 function as a first pre-amplifier and N-P-N transistors 19, 20 and 21, and P-N-P transistor 22 as a second pre-amplifier. P-N-P transistors 23 and 24 with associated circuitry function as a bistable trigger. Let it now be assumed that the temperature within the enclosure housing the crystal is higher than the selected temperature and therefore demands cooling. In this event, the resistance of the thermistor 10 will be at a relatively low value. This being the case, the base of transistor 15 becomes more positive in potential to turn on said transistor. The current through transistor 15 lowers the potential at the collector 25 thereof. Since the collector of transistor 15 is directly coupled to the base of transistor 16, this will place transistor 16 in a relatively low current conducting state. Its collector 27 then is at a relatively high potential. The collector of transistor 16 is connected through resistance $R_{27}$ to the base of transistor 17. This places transistor 17 in a relatively high current conducting state so that its collector is at a relatively low potential. This collector 28 is coupled through $R_{29}$ to the base of transistor 18. Transistor 18 is a P-N-P transistor and, consequently, due to the relatively low potential on its base is in a relatively high current conducting state. Diode 30 is therefore forward biased, lowering the base of transistor 23 to turn transistor 23 on. The collector of transistor 23 swings to a relatively high potential as transistor 23 is turned on. This positive swing is coupled through the RC circuit consisting of capacitor 32 and resistor 33 to the base of transistor 24 to shut transistor 24 off. The trigger may now be said to be in its cooling stable state. With transistor 24 off, the collector 34 thereof is at a relatively low potential. This relatively low potential is coupled through resistor $R_{35}$ to the base of transistor 36 to turn said transistor on. With transistor 36 on, the emitter 37 thereof is at a relatively low potential which turns on transistor 38.

When transistor 18 is on, the emitter 39 thereof is at a relatively low potential and this potential is coupled through resistor $R_{40}$ to the base of transistor 41, transistors 41 and 42 functioning as regulating transistors controlling the magnitude of current flow through the load. These transistors are biased to cut-off when the base potential of transistor 15 is zero. The cooling current path through load resistor $R_{39}$, composed of a bank of thermoelectric elements which may have an impedance in the neighborhood of tenths of ohms, is as follows. From ground through transistor 41, down through resistor $R_{39}$, through transistor 38 to the negative side of battery 43. This may be a six-volt battery connected as shown. The flow of current through $R_{39}$ in this direction cools the chamber. The magnitude of said load current is a function of the D.C. level on the base of transistor 41 which in turn depends on the D.C. level fed to the base of transistor 15. This latter base potential is a function of the impedance of thermistor 10 and its contribution to the potential at the tap on $R_{11}$. This latter potential depends on the difference between the selected temperature of the medium and the actual temperature thereof. As the chamber cools, the resistance of the thermistor 10 increases. The voltage supplied by the voltage divider to the base of transistor 15 then goes less positive. This results in a positive swing of the collector of transistor 15. This collector is directly connected to the base of N-P-N transistor 19. Due to the inverter action of transistor 15, ultimately transistor 19 is turned on when the temperature of the medium goes below the selected temperature. This being the case, the collector 44 of transistor 19 drops in potential. This decreases the current flowing through transistor 20 to raise the potential of the collector 45 thereof. Collector 45 is connected through resistor $R_{46}$ to the base of transistor 21. This increase in collector 45 potential increases the current flowing through transistor 21. The collector 47 of transistor 21 is thereby lowered in potential and this lower potential is coupled through resistor $R_{48}$ to the base of transistor 22. This will turn on transistor 22. Turning on transistor 22 forward biases diode 49 which in turn will turn on transistor 24. When transistor 24 turns on, the collector 34 thereof experiences a positive swing which is coupled through the RC network consisting of condenser 50 and resistor 51 to the base of transistor 23, turning said transistor off. The trigger consisting of transistors 23 and 24 is now in its other stable state or heating stable state. The emitter 52 of transistor 22 being now at a relatively low potential will turn on transistor 42. The turning on of transistor 24, on the other hand, will turn off transistors 36 and 38. Therefore, the heating current path through the load resistor $R_{39}$ is now from ground through resistor 42 up through resistor $R_{39}$ and through transistor 53 to the negative side of battery 43. The turning off of transistor 23 turns on transistor 54 which in turn turns on transistor 53. The current through the load resistor $R_{39}$ has now been reversed and it is in a heating direction.

The function of diodes 30 and 49 is to disconnect the base of the trigger transistors 23 and 24 from transistors 18 and 22 as these latter transistors approach cut-off. In this way, the base current of the transistor which is on in the trigger does not influence the base current of the appropriate differential amplifier transistor 41 or 42 as these latter transistors approach cut-off.

What has been disclosed is one embodiment of the present invention. Other embodiments obvious from the teachings herein to those skilled in the art are contemplated to be within the spirit and scope of the following claims.

What is claimed is:

1. A circuit for controlling the direction and magnitude of D.C. current through a load as a function of the difference between a predetermined D.C. level and an actual D.C. level thereby providing a D.C. level difference signal of either polarity that comprises: means to generate said difference signal, a source of D.C. current, first and second switching transistors, third and fourth regulating transistors, means connecting said first switching transistor to one end of said load, means connecting said second switching transistor to the opposite end of said load whereby direction of current through said load is in one direction when said first switching transistor is conducting and in an opposite direction when said second transistor is conducting, a bistable trigger, means connecting said difference signal to said trigger to determine the operating state thereof, means connecting said trigger to said switching transistors to render only one conducting at a time as determined by said state to thereby establish the direction of D.C. current through said load, and means connecting said difference signal to said regulating transistors to thereby determine the magnitude of the D.C. current through said load.

2. A circuit as claimed in claim 1 wherein said means connecting said difference signal to said trigger includes means to invert said difference signal and means connecting said difference signal to one side of said trigger and said inverted difference signal to the other side of said trigger.

3. A circuit as claimed in claim 2 wherein said means connecting said difference signal to said regulating transistors includes means to connect said difference signal to one of said transistors and said inverted difference signal to the other of said transistors.

4. A circuit for alternately heating and cooling a medium above and below a predetermined set temperature thereof that comprises means to generate a D.C. level difference signal of either polarity indicative of the difference between said set temperature and the actual temperature of said medium; comprising a source of D.C. current, a thermoelectric load positioned in said medium and adapted to heat said medium when the D.C. current therethrough is in one direction and to cool said medium when the D.C. current therethrough is in an opposite direction, first and second switching transistors, third and fourth regulating transistors, means connecting said first switching transistor between said source and one end of said load, means connecting said second switching transistor between said source and the opposite end of said load, whereby direction of current through said load is in one direction when said first transistor is conducting and in an opposite direction when said second transistor is conducting, a bistable trigger, means connecting said difference signal to said trigger to determine the operating state thereof, means connecting said trigger to said switching transistors to render only one conducting at a time as determined by said state to thereby establish the direction of D.C. current to said load, and means connecting said difference signal to said regulating transistors to thereby determine the magnitude of the D.C. current through said load.

5. A circuit as claimed in claim 4 wherein said means connecting said difference signal to said trigger includes means to invert said difference signal and means connecting said difference signal to one side of said trigger and said inverted difference signal to the other side of said trigger.

6. A circuit as claimed in claim 5 wherein said means connecting said difference signal to said regulating transistors includes means to connect said difference signal to one of said regulating transistors and said inverted difference signal to the other of said regulating transistors.

7. A circuit as claimed in claim 6 wherein said means to generate a D.C. level difference signal of either polarity indicative of the difference between said selected temperature and the actual temperature of said medium includes; a voltage divider, said voltage divider including a thermistor as one of the impedances therein, said thermistor being positioned in said medium.

8. A control circuit comprising a bistable trigger, a load, a first regulating transistor and a first switching transistor serially connected forming a first D.C. path through said load in one direction, a second regulating transistor and a second switching transistor serially connected forming a second D.C. path through said load in an opposite direction, means connecting opposite sides of said trigger to each of said switching transistors, respectively, whereby the state of said trigger determines the state of conduction of said switching transistors, a temperature sensing means providing a signal of one polarity responsive to a temperature above a selected temperature and a signal of opposite polarity responsive to a temperature below said selected temperature, means connecting said signals to said trigger to fix the state thereof, means connecting said signal of one polarity to said first regulating transistor to control the amount of current therethrough and means connecting said signal of opposite polarity to said second regulating transistor to control the amount of current therethrough.

9. A control circuit comprising a bistable trigger, a load, a first switching transistor forming a first D.C. path through said load in one direction, a second switching transistor forming a second D.C. path through said load in an opposite direction, means connecting opposite sides of said trigger to each of said switching transistors, respectively, whereby the state of said trigger determines the state of conduction of said switching transistors, a temperature sensing means providing a signal of one polarity responsive to a temperature above a selected temperature and a signal of opposite polarity responsive to a temperature below said selected temperature, and means connecting said signals to said trigger to fix the state thereof.

10. A control circuit comprising a bistable trigger, a load, a first regulating transistor and a first switching transistor serially connected forming a first D.C. path through said load in one direction, a second regulating transistor and a second switching transistor serially connected forming a second D.C. path through said load in an opposite direction, means connecting opposite sides of said trigger to each of said switching transistors, respectively, whereby the state of said trigger determines the state of conduction of said switching transistors, means providing a signal of one polarity and a signal of opposite polarity, means connecting said signals to said trigger to fix the state thereof, means connecting said signal of one polarity to said first regulating transistor to control the amount of current therethrough and means connecting said singal of opposite polarity to said second regulating transistor to control the amount of current therethrough.

References Cited in the file of this patent

UNITED STATES PATENTS

| | | |
|---|---|---|
| 2,751,549 | Chase | June 19, 1956 |
| 2,776,382 | Jensen | Jan. 1, 1957 |
| 2,952,786 | Lewis | Sept. 13, 1960 |
| 2,956,175 | Bothwell | Oct. 11, 1960 |